United States Patent
Pfaffinger et al.

(10) Patent No.: US 10,555,422 B2
(45) Date of Patent: *Feb. 4, 2020

(54) METHOD AND SYSTEM FOR POPULATING PRINTED CIRCUIT BOARDS

(71) Applicant: SIEMENS AKTIENGESELLSCHAFT, München (DE)

(72) Inventors: Alexander Pfaffinger, München (DE); Christian Royer, Ottobrunn (DE)

(73) Assignee: Siemens Aktiengesellschaft (DE)

( * ) Notice: Subject to any disclaimer, the term of this patent is extended or adjusted under 35 U.S.C. 154(b) by 208 days.

This patent is subject to a terminal disclaimer.

(21) Appl. No.: 15/542,658

(22) PCT Filed: Nov. 19, 2015

(86) PCT No.: PCT/EP2015/077065
§ 371 (c)(1),
(2) Date: Jul. 11, 2017

(87) PCT Pub. No.: WO2016/113021
PCT Pub. Date: Jul. 21, 2016

(65) Prior Publication Data
US 2017/0374745 A1    Dec. 28, 2017

(30) Foreign Application Priority Data

Jan. 14, 2015 (DE) .......................... 10 2015 200 420

(51) Int. Cl.
*G06F 19/00* (2018.01)
*H05K 3/34* (2006.01)
(Continued)

(52) U.S. Cl.
CPC ............... *H05K 3/34* (2013.01); *G06Q 10/06* (2013.01); *H05K 3/0097* (2013.01)

(58) Field of Classification Search
CPC .................................. H05K 3/34; G06Q 10/06
(Continued)

(56) References Cited

U.S. PATENT DOCUMENTS 5,155,679 A     10/1992  Jain et al.
5,258,915 A  *  11/1993  Billington .............. G06Q 10/04
                                                          700/103
(Continued)

FOREIGN PATENT DOCUMENTS

DE          69028612 T2    1/1997
DE       102011076565 A1   11/2012
(Continued)

OTHER PUBLICATIONS

International Search Report for PCT/EP2015/077065; 4 Pgs.

*Primary Examiner* — Md Azad
(74) *Attorney, Agent, or Firm* — Schmeiser, Olsen & Watts LLP (57) ABSTRACT

Provided is a method for populating printed circuit boards, which includes the steps of acquiring jobs, in each case relating to populating printed circuit boards of a printed circuit board type on the pick-and-place line, and associated probabilities by a job is to be executed in each case, assigning printed circuit board types of the jobs to set-up families, determining for each set-up family the characteristic number which comprises the sum of probabilities of those jobs, the printed circuit board types of which are comprised by the set-up family, optimizing the assignment in such a way that the characteristic numbers of different set-up families are as different as possible, providing a set-up from one of the determined set-up families on the pick-and-place line, and populating printed circuit boards on the pick-and place line.

9 Claims, 6 Drawing Sheets

(51) Int. Cl.
*G06Q 10/06* (2012.01)
*H05K 3/00* (2006.01)
(58) Field of Classification Search
USPC .......................................................... 700/121
See application file for complete search history.

(56) References Cited

U.S. PATENT DOCUMENTS

| | | | | |
|---|---|---|---|---|
| 6,487,544 | B1* | 11/2002 | Eshelman | G06N 3/126 706/13 |
| 2004/0143352 | A1* | 7/2004 | Gyorfi | G06Q 10/06 700/99 |
| 2007/0204086 | A1* | 8/2007 | Jaroszewski | H05K 13/085 710/262 |
| 2012/0004762 | A1* | 1/2012 | Bauer | H05K 13/085 700/219 |
| 2014/0277680 | A1* | 9/2014 | Youngquist | B23K 26/352 700/121 |
| 2015/0135505 | A1 | 5/2015 | Royer | |
| 2015/0195966 | A1 | 7/2015 | Pfaffinger et al. | |
| 2015/0296671 | A1 | 10/2015 | Pfaffinger et al. | |

FOREIGN PATENT DOCUMENTS

| | | |
|---|---|---|
| DE | 102012220904 A1 | 5/2014 |
| EP | 0478360 A1 | 4/1992 |
| WO | WO 2014005741 A1 | 1/2014 |
| WO | WO 2014005742 A1 | 1/2014 |

\* cited by examiner

METHOD AND SYSTEM FOR POPULATING PRINTED CIRCUIT BOARDS

CROSS-REFERENCE TO RELATED APPLICATIONS

This application claims priority to PCT Application No. PCT/EP2015/077065, having a filing date of Nov. 19, 2015, based off of German application No. 1020152004 20.1 having a filing date of Jan. 14, 2015, the entire contents both of which are hereby incorporated by reference.

FIELD OF TECHNOLOGY

The following relates to a method and a system for populating printed circuit boards. To this end, a pick-and-place line is provided, which is designed to populate printed circuit boards with components.

BACKGROUND

An electronic module comprises a printed circuit board and components which are mechanically and electrically attached thereto. To produce the printed circuit board, components are arranged on the printed circuit board using an automatic pick-and-place unit, and thereafter soldered thereto in a reflow oven. A plurality of automatic pick-and-place units can be arranged sequentially on a pick-and-place line. For the production of multiple printed circuit boards, a pick-and-place system can be employed, comprising a plurality of pick-and-place lines.

A combination of component types on the automatic pick-and-place unit is described as a set-up. Using a set-up, a quantity of different printed circuit boards can be produced, which are described as a set-up family. Customarily, however, printed circuit boards of more different printed circuit board types are to be produced than is possible using a single set-up, thereby necessitating a change of set-up in the course of production.

A set-up can be accommodated on one or more set-up tables, which can easily be replaced on the automatic pick-and-place unit. However, the equipment of a set-up table with components of predefined component types is complex. Consequently, a distinction is frequently drawn between fixed set-ups and variant set-ups, wherein a fixed set-up table is intended to retain its composition of component types over a predefined planning period, whereas a variant set-up table will foreseeably be refitted within said planning period.

DE 10 2012 220 904 A1 relates to a method for determining a most advantageous fixed set-up possible for a pick-and-place line.

SUMMARY

An aspect relates to an improved method, a computer program product and a system for populating printed circuit boards which permit a more efficient population of a pick-and-place line.

For populating printed circuit boards by a pick-and-place line, set-up families having associated set-ups are provided. Each set-up family is assigned at least one printed circuit board type, and each set-up is assigned at least one component type, such that a printed circuit board of a printed circuit board type of a set-up family can be populated by components of the component types of the set-up assigned to the printed circuit board type on the pick-and-place line. A set-up can be implemented in the form of supplies of components of the component types, in order to be fitted on the pick-and-place line. A method for populating printed circuit boards comprises steps of acquiring jobs, in each case relating to the population of printed circuit boards of a printed circuit board type on the pick-and-place line, and associated probabilities with which a job is to be executed in each case, assigning printed circuit board types of the jobs to set-up families, determining, for each set-up family, a characteristic number which comprises the sum of probabilities of those jobs, the printed circuit board types of which are comprised by the set-up family, optimizing the assignment in such a way that the characteristic numbers of different set-up families are as different as possible, providing a set-up from one of the determined set-up families on the pick-and-place line, and populating printed circuit boards on the pick-and-place line.

Jobs can be associated with practically any time period in the future. Customarily, it is not known—or not exactly known—when a job is actually on hand, and thus when the job is to be executed. The operation of the pick-and-place line customarily follows a predefined rotation wherein, for a given forthcoming period, it is known in each case which jobs are to be processed. The probability of the job indicates how probable it is that a job will need to be executed within any given time period.

By means of the method, set-ups or set-up families can be constituted in consideration of the knowledge that the population of specific printed circuit board types will recur on a regular basis. The determination of set-ups can thus be improved, such that the change of set-ups during production is reduced. The number of set-ups to be produced can thus be reduced. Preferably, by the method, fixed set-ups are defined which, within a long-term planning period, for example of several days or weeks, are to be fitted to the pick-and-place line in a repeated manner. Jobs which, at the time of execution of the method, are not known, can be processed by variant set-ups, which are only equipped on a one-off basis, then employed on the pick-and-place line on a one-off basis and removed again thereafter. Of the present jobs, not all will need to be considered in the determination of fixed set-ups, as described hereinafter—specifically, jobs with the lowest probabilities can also be ignored in the constitution of fixed set-ups.

Preferably, optimization is executed such that the number of set-up families is minimized. A number of set-ups can also be reduced accordingly, thereby generating advantages with respect to handling and costs.

The method can be executed with respect to a predefined time period, wherein the processing time for a job does not exceed said time period. Specifically, the probabilities can relate to the occurrence of a job within the respective time period. This time period is also described as the short-term planning horizon and can, for example, be one day. In other words, it is preferably assumed that each job can be completely processed before the time period has expired. Customarily, predefined jobs to be processed are specified for each time period.

Probabilities can be determined with reference to previous jobs. For example, experiences obtained from previous production periods can be advantageously employed. Specifically, frequencies of previous jobs can be known, and probabilities determined therefrom. Alternatively or additionally, knowledge of forthcoming jobs can also be employed. In an actual production operation, for example, jobs can be defined for a specific rotation.

In a first variant, the set-up families are constituted individually in sequence, wherein optimization is executed in each case such that a number of jobs which can be processed using set-ups from the set-up families is maximized.

In a second variant, the set-up families are constituted individually in sequence, and optimization is executed in each case such that, for the printed circuit board types assigned to a new set-up family, the following characteristic number is minimized:
$\log(1-p_r)$; where $p_r$ is the probability of an occurrence of a job for the population of printed circuit boards of printed circuit board type r. The probability customarily relates to the predefined time period, i.e. the short-term planning horizon.

Optimization is preferably executed by mixed integer optimization. Effective optimization can thus be achieved in a relatively short processing time; the discrepancy (gap) of optimization from a best possible solution can also be defined.

A computer program product comprises programming code means or programming code for executing a method, where said computer program product is run on a processing device or is stored on a computer-readable data medium.

A control unit is designed for acquiring jobs, in each case relating to the population of printed circuit boards of a printed circuit board type on the pick-and-place line, and associated probabilities with which a job is to be executed in each case, assigning printed circuit board types of the jobs to set-up families, determining, for each set-up family, a characteristic number which comprises the sum of probabilities of those jobs, the printed circuit board types of which are comprised by the set-up family, optimizing the assignment in such a way that the characteristic numbers of different set-up families are as different as possible, and controlling the population of printed circuit boards on the pick-and-place line, where a set-up from one of the determined set-up families is fitted on the pick-and-place line.

BRIEF DESCRIPTION

Some of the embodiments will be described in detail, with references to the following figures, wherein like designations denote like members, wherein.

DETAILED DESCRIPTION

Figure 1:
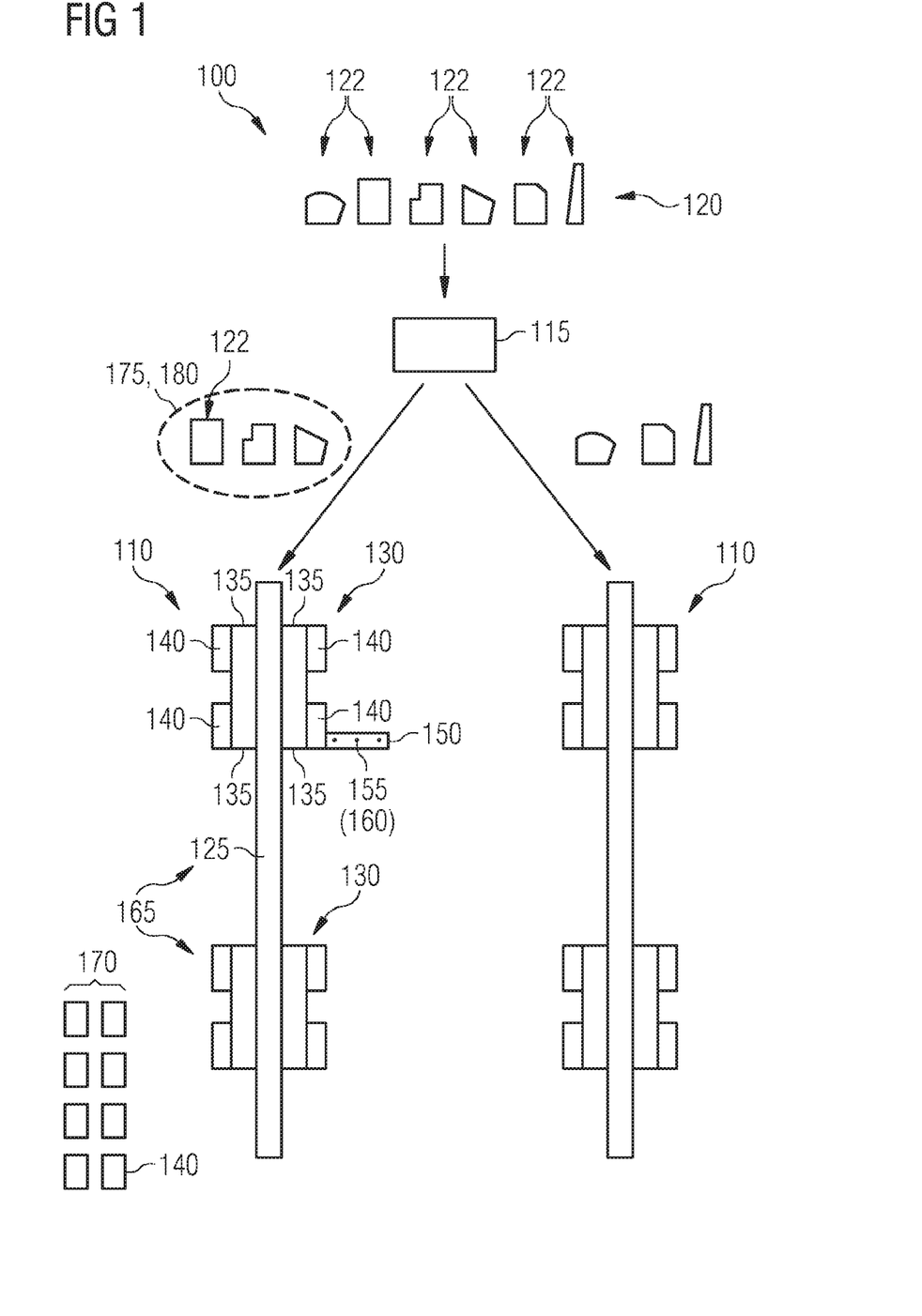
FIG. 1 shows a pick-and-place system, in accordance with embodiments of the present invention.

FIG. 1 shows an exemplary pick-and-place system 100. The pick-and-place system 100 comprises one or more pick-and-place lines 110 and a processing or control unit 115. Each pick-and-place line 110 comprises an optional conveyor system 125 and one or more automatic pick-and-place units 130. Each automatic pick-and-place unit 130 comprises one or more pick-and-place heads 135, each of which is designed for the pick-up of components 155 from a set-up table 140 and the placement thereof at a predefined position on the printed circuit board 120, which is located on the conveyor system 125. During the population process, the printed circuit board 120 is customarily stationary, in relation to the automatic pick-and-place unit 130.

The set-up tables 140 each comprise a plurality of infeed devices 150 of which, in FIG. 1, only one is represented for exemplary purposes. Each infeed device 150 holds a stock of components 155 of a predefined component type 160. For the components 155, the infeed device 150 customarily has a holding capacity, which can be expressed in terms of tracks. A track is customarily 8 mm wide, and the number of tracks on a set-up table 140 is limited, for example to 40. Components 155 of the same component type 160 are customarily delivered in the form of a belt, on a tablet or in a tube. Each component type 160 requires a predefined number of tracks on the infeed device 150 and on the set-up table 140, which are customarily mutually adjoining.

Generally, an infeed device 150 can be configured for the accommodation of components 155 of different component types 160 and, customarily, different infeed devices 150 can be fitted to a set-up table 140. In the present case, in the interests of simplification, it is assumed that a stock of components 155 of a component type 160 on an infeed device 150 is practically inexhaustible, such that restocking is not required.

If, on the automatic pick-and-place unit 130, a component 155 of a component type 160 is required which is not present on one of the set-up tables 140, customarily, the assignment of components 155 on one of the set-up tables 140 fitted is not altered, but the set-up table 140 is completely replaced with another and appropriately-populated set-up table 140. The population of a set-up table 140, which is not fitted to the pick-and-place line 110, with components 155 is described as prefitting, and can require a processing time of the order of one or more hours, for example approximately 6-10 hours.

As a change of set-up tables 140 on the pick-and-place line 110, or so-called set-up change, is customarily associated with an interruption in production, it is endeavored to change the set-up tables 140 as infrequently as possible. Given that, moreover, the set-up tables 140 are expensive, and the changeover of a set-up table 140 can be a complex and lengthy operation, it is moreover endeavored to constitute the smallest possible number of set-ups, in order to manufacture a predefined production volume of printed circuit boards 120 of predefined printed circuit board types 122. In this case, the production volume comprises a plurality of printed circuit board types 122, of which in each case a predetermined batch quantity of printed circuit boards 120 is to be populated with components 155 of predefined component types 160. For example, 300 printed circuit boards 120 of a first printed circuit board type 122, and 200 printed circuit boards 120 of a second circuit board type 122, can be populated.

A set-up 165, 170 comprises a quantity of component types 160, and is comprised of one or more set-up tables 140, which are equipped with stocks of components 155 of the component types 160 of the set-up 165, 170, and are fitted to the pick-and-place line 110.

A set-up family 175 is assigned to the set-up 165, 170, which comprises printed circuit board types 122, from which printed circuit boards 120 can be populated by components 155 of the component types 160 from the set-up 165, 170. A set-up family 175 is specifically assigned to a set-up 165, 170 and vice versa.

In order to increase capacity utilization on a pick-and-place line 110, or to reduce a requirement for set-up tables 140, the constitution of set-up families 175 on the basis of the printed circuit board types 122 to be populated is therefore critical. The constitution of set-ups 165, 170 or set-up families 175 can involve the consideration of ancillary conditions, such as compliance with a limited holding capacity of a set-up table 140 for component types 160 or a grouping of predefined printed circuit board types 160 in the same set-up family 175, for example on the grounds of the use of lead-based or lead-free solder.

Set-ups can be divided into fixed set-ups 165 and variant set-ups 170, wherein the fitting of a fixed set-up 165 is intended to remain unchanged on a number of shuttle tables 140 over a predefined planning period, whereas a shuttle table 140 of a variant set-up 170 will foreseeably be refitted with components 155 of different component types 160 within the planning period. The planning period can be, for example, 6-12 months. A variant set-up 165 is customarily present in a predefined configuration for a substantially shorter time than the planning period, for example a number of hours or days, but customarily not more than one week.

A static set-up can also be constituted, which includes elements of the fixed set-up 165 and the variant set-up 170. The static set-up, in the same way as the fixed set-up 165, is constituted for a longer period, during which it customarily remains unchanged. However, a static set-up does not customarily remain fitted, i.e. constituted as a physical set-up on set-up tables 140, but can also be removed after use. Moreover, a static set-up can also be fitted (i.e. completed) on a partial basis only if, for example, the static set-up comprises a plurality of printed circuit board types 122 and, at a given time point, only jobs for the production of printed circuit boards 120 of some of these printed circuit board types 122 are on hand. In this case, components 155 of such component types 160 which are not required for the population of the printed circuit boards 120 ordered do not need to be fitted.

Administratively, the static set-up is substantially easier to manage than a fixed set-up 165 or a variant set-up 170. If the static set-up, further to the use thereof, is not set down, it can also be described as a fixed set-up 165. Hereinafter, unless indicated otherwise, reference is preferably intended to static set-up families and the static set-ups assigned thereto.

Set-ups 165, 170 can be replaced, as required, on the pick-and-place line 110. In order to constitute a fixed set-up 165 or a variant set-up 170, a set-up table 140, while not fitted to the pick-and-place line 110, can be equipped with stocks of components 155 of predefined component types 160. Previously fitted components 155 of component types 160 which are not required can be removed beforehand. This refit can involve a substantial amount of manual labor, and can be time-intensive.

In order to minimize the complexity associated with a variant set-up 170, it is endeavored that fixed set-ups 165 should accommodate as many printed circuit board types 122 as possible. In practice, however, a target case involving no variant set-ups 170 is scarcely achievable.

The control device 115, in the context of the control of the pick-and-place system 100, assigns printed circuit board types 122, the associated printed circuit boards 120 whereof are to be populated on the pick-and-place line 110, to one set-up family 175 respectively, wherein fixed set-up families 175, which are assigned respectively to a fixed set-up 165, and variant set-up families 175, which are assigned respectively to a variant set-up 170, can be constituted.

In practice, for example, for a given production quantity of printed circuit board types 122, in a first step, a fixed set-up 165 is constituted for a (largest possible) proportion of printed circuit board types 122, whereafter, in a second step, variant set-ups 170 are constituted for the remaining proportion of printed circuit board types 122. The quality of these assignment operations dictates, to a substantial degree, the extent of effective capacity utilization of production means of the pick-and-place system 100, and how efficiently population is executed.

Figure 2:
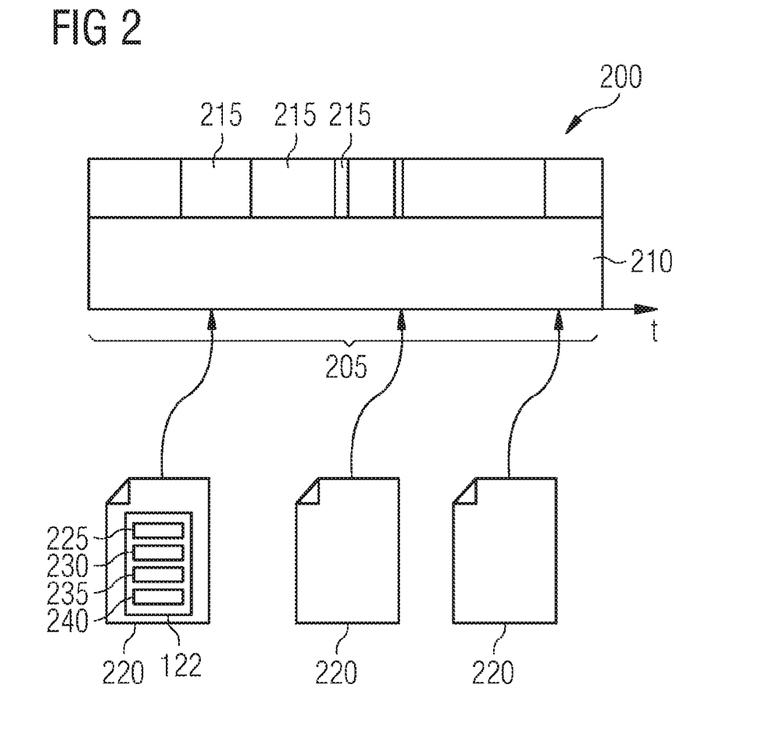
FIG. 2 shows a representation of set-up families on a pick-and-place line according to FIG. 1.

FIG. 2 shows a representation of exemplary set-up families 175 on a pick-and-place line 110 according to FIG. 1. In this case, the set-up families 175 are divided into a fixed set-up family 210, which is assigned to a fixed set-up 165, and a variant set-up family 215, which is assigned to a variant set-up 170. In the example represented, within a planning period 205, printed circuit board types 122 of a single fixed set-up family 210 or of a single variant set-up family 215 can be populated on the pick-and-place line 110.

It is assumed that, at the start of the planning period 205, a number of jobs 220 are on hand, which are to be executed as efficiently as possible. The number of jobs is described as the job number. Each job 220 comprises at least one printed circuit board type 122 and one batch quantity 225 of printed circuit boards 120 to be populated. Component types 160 are assigned to the printed circuit board type 122, components 155 whereof are to be fitted to the individual printed circuit boards 120.

Further information can be assigned to a printed circuit board type 122. For example, a number 230 of component types 160 which are to be fitted to each printed circuit board 120, a number 235 of population positions on a printed circuit board 120, or a production time 240 for a printed circuit board 120 of the respective printed circuit board type 122, can be indicated. The number of population positions corresponds to the number of components 155 which are to be fitted to a printed circuit board 120 of a printed circuit board type 122, of whatever component type 160. Moreover, a job number 245 can be indicated, which indicates how many jobs 220 for the population of printed circuit boards 120 of a printed circuit board type 122 are on hand within a predefined planning period 205.

By the employment of mathematical methods, significantly superior solutions for the assignment of printed circuit board types 122 to fixed set-up families 175 or to pick-and-place lines 110 can be achieved than by the methods applied previously in practice. For the determination of an optimum assignment of printed circuit board types 122 to a fixed set-up family 175, automatic optimization can be employed. To this end, different optimization methods can be applied, for example, on the basis of local search methods or metaheuristic algorithms.

Preferably, however, an IP model (integer programming or an integer program, or a mixed integer optimization model) is employed. One of the principal methods in the field of mathematical optimization is linear optimization, which involves the optimization of linear target functions in respect of a quantity which is restricted by linear equalities and inequalities. Linear optimization forms the basis of the procedural solution of (mixed) integer linear optimization.

Advantages of linear optimization are as follows:
A global optimization approach
Easily extendable
Commercial availability of very effective standard solvers (Ilog, Gurobi, Xpress), which are widespread and proven in practice,
For any solution determined, the maximum discrepancy thereof (gap) from the optimum solution is known.

Hereinafter, examples of IP formulations are provided for the optimization of the described assignment of printed circuit board types 122 to a fixed set-up family 175.

A short-term planning period $T_K$ is assumed, for example of several hours or days, and a long-term planning period $T_L$, which is a number of times longer than $T_K$, for example of several days, weeks or months. Fixed set-ups are defined for the pick-and-place line 110, which are to remain unchanged over the long-term planning period $T_L$, and can be employed a number of times. The definition should proceed such that, in the operation of the pick-and-place line 110, as few set-up changeovers and as few set-ups as possible are required. To this end, the circumstance is exploited whereby, at the time of definition of fixed set-ups, some information on forthcoming jobs is already known.

In the operation of the pick-and-place line 110, it is known which jobs are to be processed in the next respective short-term planning period. If a job cannot be processed using one of the fixed set-ups, a variant set-up must be prepared. The frequency of set-up changeovers, and the frequency of the necessity for the preparation of variant set-ups, is therefore critically dependent upon the quality of the aforementioned assignment of printed circuit board types to fixed set-up families.

Symbols

R is the quantity of printed circuit board types

Cl is the quantity of set-up families, consisting of all the printed circuit board types from R Order$_r$ is the number of jobs for the printed circuit board type r in the long-term planning period $T_L$ is the number of days in the long-term planning period $T_K$ is the number of days in the short-term planning period Evaluation Model Order$_r \leq T_L/T_K$ applies. This condition can be fulfilled, where applicable, by a setting for Order$_r := T_L/T_K$.

$p_r$ is the probability of the execution of a job for the population of a printed circuit board 120 of a printed circuit board type 122 within the short-term planning period $T_K$, for example 0.08. The probability $p_r$ corresponds to the average relative frequency at which such jobs occur, in the above case, for example, where 8 such jobs are to be executed in the course of 100 short-term planning periods $T_K$. This frequency can be determined, for example, with reference to previous planning periods $T_K$, or with reference to the knowledge of forthcoming jobs.

It is assumed that, in each case, jobs are distributed evenly over the short-term planning periods $T_K$.

$$p_r = \frac{T_K \text{Order}_r}{T_L}$$

It is further assumed that the jobs are mutually independent. Within the short-term planning period $T_K$, all jobs on hand can be processed by the fixed set-up and one or more variant set-ups. To this end, each variant set-up required in the short-term planning period $T_K$ is set up only once, all the printed circuit boards of the assigned printed circuit board types which are to be produced are populated, and the variant set-up is set down again thereafter. A further application of the variant set-up on the pick-and-place line 110 is not anticipated.

The expected value for the required set up of a set-up family cl∈Cl on the pick-and-place line 110 within the short-term planning period is determined as follows:

$EW(cl)$ = probability that at least one module $r \in cl$ must be produced

-continued

= 1 − probability that no module $r \in cl$ must be produced $$= 1 - \prod_{r \in cl}(1 - p_r)$$

An expected value "EW(Number)" for the number of set-up families to be set up within a short-term planning period is thus given by the following:

$$EW(\text{Number}) = \sum_{cl \in Cl} 1 - \prod_{r \in cl}(1 - p_r)$$

$$= \text{Number of set-up families} - \sum_{cl \in Cl} \prod_{r \in cl}(1 - p_r)$$

This expected value is an effective quality criterion for a quantity of fixed set-up families Cl.

EXAMPLES

In the following examples, the long-term planning period is 100 days and the short-term planning period is 1 day. It has been shown that, with respect to the order number, unbalanced fixed set-up families are tendentially superior to balanced fixed set-up families.

Modules and their associated job numbers are given by the following:

| | Module | | | | | |
|---|---|---|---|---|---|---|
| | r1 | r2 | r3 | r4 | r5 | r6 |
| Number of jobs | 90 | 70 | 50 | 50 | 30 | 10 |
| pr | 0.9 | 0.7 | 0.5 | 0.5 | 0.3 | 0.1 |

It is assumed that the set-ups, for example by means of the capacities of the set-up tables, are restricted in each case to the accommodation of components of component types for two printed circuit board types only, such that a set-up family can only accommodate two printed circuit board types.

Figure 3A:
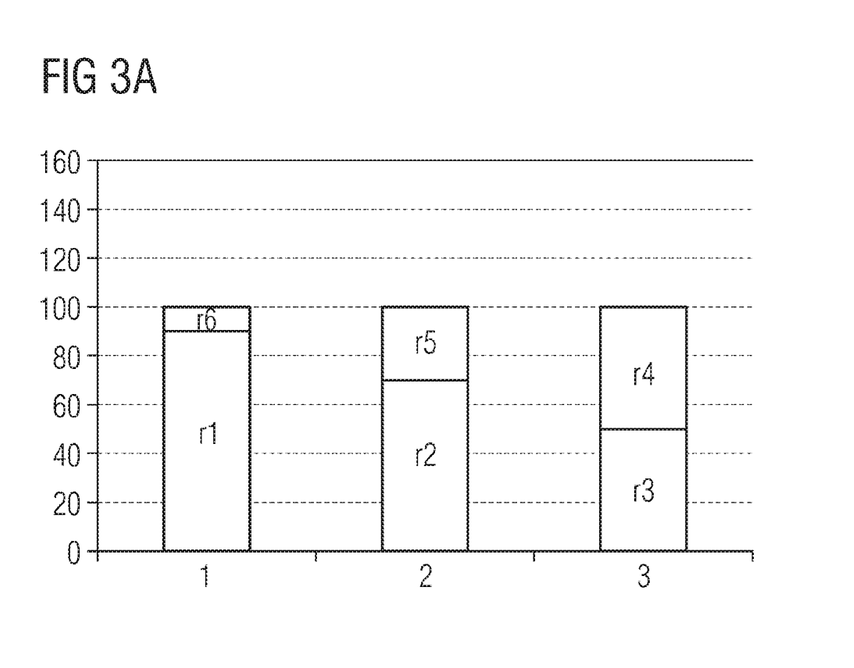
FIGS. 3-5 show job numbers for various set-up families in different examples.

FIG. 3a represents balanced set-up families with respect to absolute job frequencies. A job number is plotted on the vertical axis, while different set-up families are represented on the horizontal axis. The first set-up family can be used to process the jobs r1, the second to process the jobs r2 and r5, and the third to process the jobs r3 and r4.

The expected value EW for the number of set-ups in the short-term planning period is as follows:

$$EW = 3 - (0.1 * 0.9 + 0.3 * 0.7 + 0.5 * 0.5)$$
$$= 3 - (0.09 + 0.21 + 0.25)$$
$$= 3 - 0.55$$
$$= 2.45$$

Figure 3B:
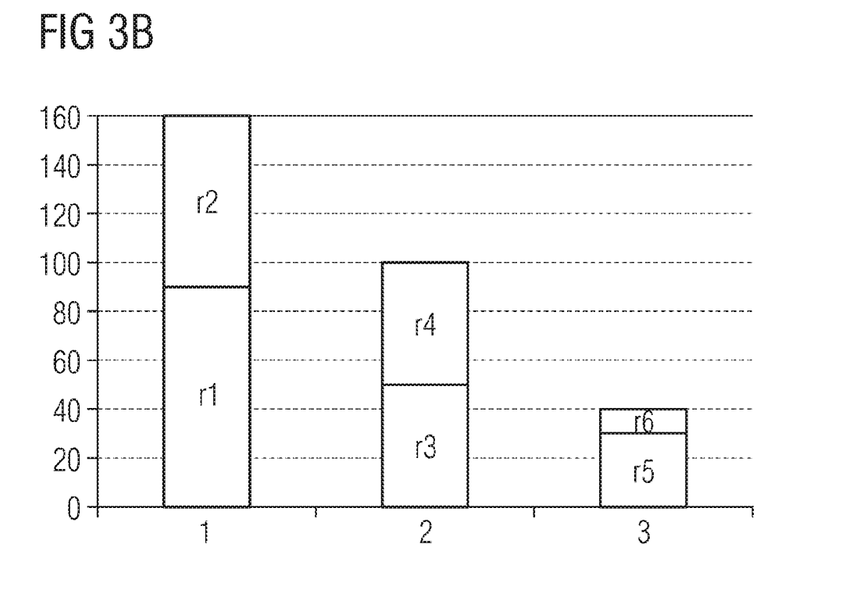

FIG. 3b represents unbalanced set-up families with respect to absolute job frequencies. The expected value for the number of set-ups is the short-term planning period is now only 2.09 set-ups. Fewer set-up changeovers are therefore required, thereby permitting the efficiency of the pick-and-place line 110 to be improved.

Improved Solution with an Additional Set-up Family

Hereinafter, it is demonstrated that it is not always better to pursue the target of a minimum number of set-up families. Modules and the number of corresponding jobs within the long-term planning horizon are given by the following:

| Module | r1 | r2 | r3 | r4 | r5 |
|---|---|---|---|---|---|
| Number of jobs | 90 | 50 | 50 | 10 | 10 |
| pr | 0.9 | 0.5 | 0.5 | 0.1 | 0.1 |

Figure 4A:
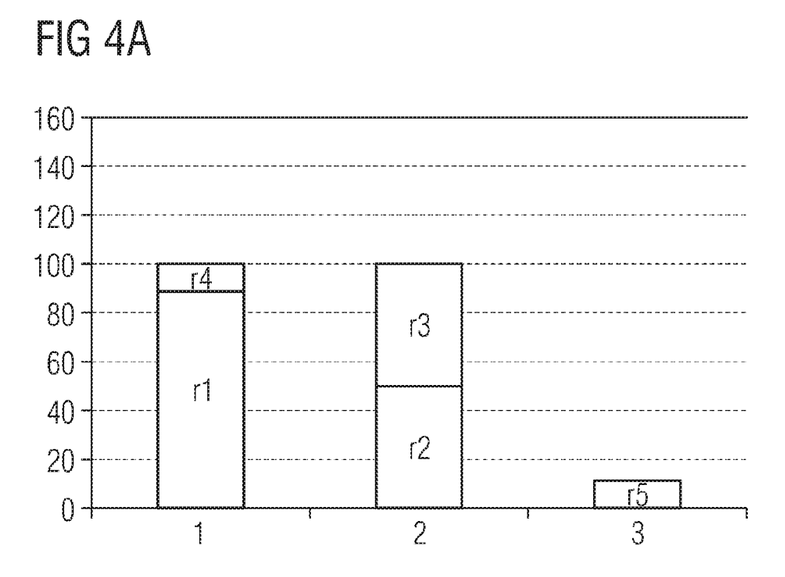

FIG. 4a shows a breakdown of jobs into three set-up families. The expected value for the number of set-ups in the short-term planning period is 1.76 set-ups.

Figure 4B:
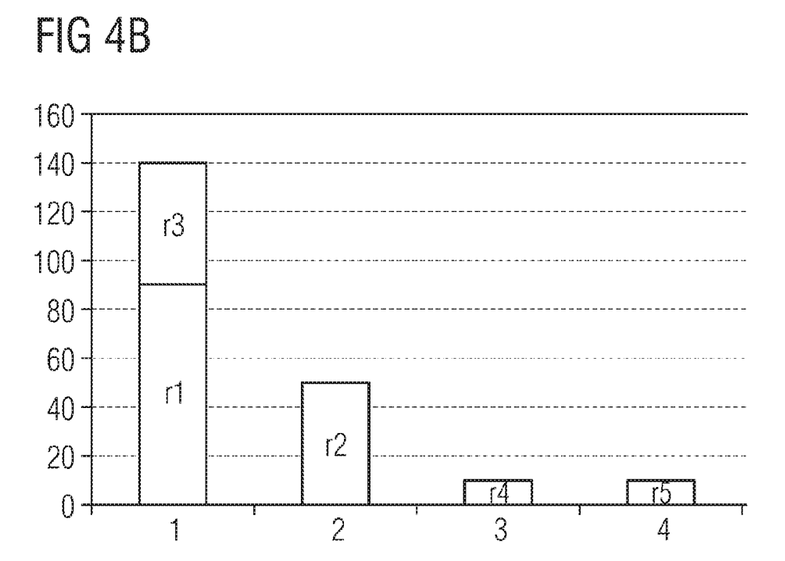

FIG. 4b shows a breakdown involving four set-up families. The expected value for the number of set-ups in the short-term planning period is 1.65 set-ups:

$$EW = 4 - (0.1 * 0.5 + 0.5 + 0.9 + 0.9)$$
$$= 4 - 2.35$$
$$= 1.65$$

Heuristics

The assignment problem can be formulated as a mixed integer non-linear optimization problem. It is assumed, however, that this problem can only be resolved with difficulty. Consequently, various heuristics are proposed hereinafter, in order to permit the resolution of the problem by means of linear optimization.

Heuristic 1

Using the method described in patent application DE 10 2012 220 904.2, set-ups can be constituted with a maximum number of jobs. Using this method, heuristic 1 involves the constitution of successive fixed set-up families, each with a maximum number of jobs. Accordingly, the set-up families are fully-packed, and the resulting number of set-up families is relatively low. Moreover, the last set-up families to be constituted include only very few jobs, which only increase the anticipated number of set-ups to a limited extent (c.f. the previous example in FIGS. 3b and 3c).

Heuristic 2

In common with heuristic 1, heuristic 2, by the application of the aforementioned method, involves the successive constitution of set-up families cl from the quantity of residual modules. In this case, however, the target criterion:

$$EW(cl) = 1 - \prod_{r \in cl}(1 - p_r)$$

assumes a maximum value in each case. To this end, in the method according to application DE 10 2012 220 904.2, the MIP target function is adjusted as follows.

R' represents the quantity of residual modules, which are not yet incorporated in fixed set-up families. It is moreover assumed that pr<1 applies to all r∈R'. Only one fixed set-up family/static set-up family cl is constituted. The following designation from MIP also applies:

$Assign_{r,cl}$: a variable which indicates whether a printed circuit board r is assigned to a fixed set-up family cl. If an assignment exists, this variable assumes a value of 1, or otherwise assumes a value of 0.

The target function max EW(cl) can be formulated as a non-linear target function with the whole-number variables $Assign_{r,cl}$:

$$\text{maximize } 1 - \prod_{r \in R'}(1 - p_r)^{Assign_{r,cl}}$$

This is equivalent to:

$$\text{minimize } 1 - \prod_{r \in R'}(1 - p_r)^{Assign_{r,cl}} \quad (*)$$

The following also applies:

$$\prod_{r \in R'}(1 - p_r)^{Assign_{r,cl}} = e^{\log \prod_{r \in R'}(1-p_r)^{Assign_{r,cl}}}$$

As the exponential function increases in a strictly monotonic manner, and the following applies $$\log \prod_{r \in R'}(1-p_r)^{Assign_{r,cl}} = \sum_{r \in R'} \log(1-p_r) Assign_{r,cl}$$

the target function (*) is equivalent to:

$$\text{minimize } \sum_{r \in R'} \log(1 - p_r) Assign_{r,cl}$$

This target function is linear, and can thus be employed in MIP as a new target function. In one example, in which heuristic 2 is superior to heuristic 1, the modules and job numbers considered are as follows:

| Module | r1 | r2 | r3 | r4 |
|---|---|---|---|---|
| Number of jobs | 90 | 50 | 50 | 50 |

It is assumed that r1 is appropriate to only one further printed circuit board type in a set-up family, and that r2-r4 are appropriate to a common set-up family.

FIG. 5a shows the result of heuristic 1. The expected value for the number of set-ups in the short-term planning period is 1.775 set-ups.

Figure 5B:
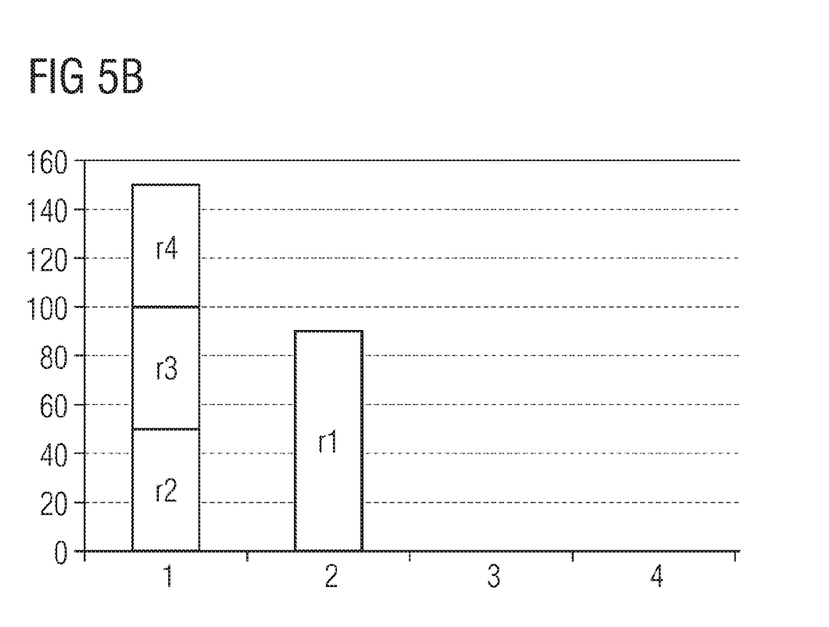

FIG. 5b shows the result of heuristic 2. The expected value for the number of set-ups in the short-term planning period is 1.7 set-ups.

Heuristic 3

If, by the application of heuristics 1 and 2 respectively, the minimum number of set-up families is exceeded, a further heuristic 3 is proposed.

Figure 6:
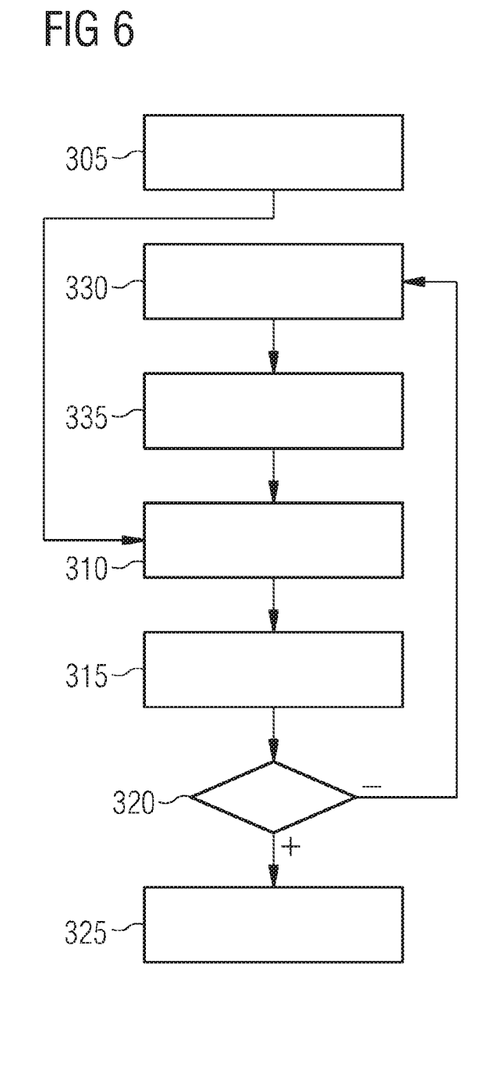
FIG. 6 shows a flow chart of a method for the constitution of fixed set-ups for a pick-and-place system according to FIG. 1.

FIG. 6 shows a flow diagram of a method 300 for heuristic 3. The method 300 commences with a step 305, in which the quantity of printed circuit board types R' yet to be assigned is equal to the original quantity of printed circuit board types R to be assigned. The present set-up family $cl_{opt}$ is blank in the first instance.

Thereafter, in a step 310, the remaining modules from R' are divided into set-up families, for example using the "method for constituting set-up families on pick-and-place lines" described in patent application DE 201 213 064, such that, in each iteration, a further alternative solution $cl_{min}$ is obtained respectively.

The combination of the solutions $cl_{opt}$ and $cl_{min}$ is evaluated in a step 315 with respect to the expected value for the number of set-ups in the short-term planning horizon, and the best solution is selected.

In a step 320, it is decided whether further printed circuit board types are present in R'. If this is not the case, the method 300 terminates at step 325. Otherwise, the method proceeds directly to a step 330. Alternative or additional interruption criteria, such as the achievement of a maximum execution time or the constitution of a predefined number of fixed set-ups, are also possible.

In step 330, again as in the case of heuristics 1 and 2, for example by the method described in DE 10 2012 220 904.2, a set-up family $cl_{opt}$ is constituted successively with respect to a maximum job number or a maximum expected value.

In a subsequent step 325, $cl_{opt}$ is added to the set-up family quantity $Cl_{opt}$. The printed circuit boards of $cl_{opt}$ are removed from R'. Thereafter, the method 300 continues with the aforementioned step 310.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The claims are as follows:
1. A method for populating printed circuit boards by a pick-and-place line,
   wherein set-up families having associated set-ups are provided,
   wherein each set-up family is assigned at least one printed circuit board type, and each set-up is assigned at least one component type,
   such that a printed circuit board of the printed circuit board type of a set-up family can be populated by components of which include the at least one component type of the set-up assigned to the printed circuit board type on the pick-and-place line;
   wherein the set-up can be implemented in a form of supplies of components and wherein the components include the at least one component type, in order to be fitted on the pick-and-place line,
   wherein the method comprises the following steps:
   acquiring jobs, in each case relating to a population of the printed circuit boards of the printed circuit board type on the pick-and-place line, and associated probabilities with which a job is to be executed in each case;
   assigning the printed circuit boards of which include the at least one circuit board type of the jobs to the set-up families;
   determining, for each set-up family, a characteristic number which comprises a sum of probabilities of those jobs, the printed circuit board types of which are comprised by the set-up family,
   optimizing the assignment in such a way that characteristic numbers of different set-up families are different,
   providing the set-up from one of determined set-up families on the pick-and-place line; and
   populating the printed circuit boards on the pick-and-place line.

2. The method as claimed in claim 1, wherein the step of optimizing is executed such that the number of set-up families is minimized.

3. The method as claimed in claim 1, wherein the method is executed with respect to a predefined time period, wherein a processing time for the job does not exceed said time period.

4. The method as claimed in claim 1, wherein probabilities are determined with reference to previous jobs.

5. The method as claimed in claim 1, wherein the set-up families are constituted individually in sequence, and the step of optimizing is executed in each case such that a number of jobs which can be processed using the set-ups from the set-up families is maximized.

6. The method as claimed in claim 1, wherein the set-up families are constituted individually in sequence, and the step of optimizing is executed in each case such that, for the printed circuit board types assigned to a new set-up family, the following characteristic number is minimized: $\log(1-p_r)$; where $p_r$ is the probability of an occurrence of a job for the population of the printed circuit boards of printed circuit board type r.

7. The method as claimed in claim 1, wherein the step of optimizing is executed by mixed integer optimization.

8. A computer program product, comprising a computer readable hardware storage device having a computer readable program code stored therein, said program code executable by a processor of a computer system to implement a method with programming code means for executing the method according to claim 1, where said computer program product is run on a processing device or is stored on a computer-readable data medium.

9. A control device for populating printed circuit boards by a pick-and-place line,
   wherein set-up families having associated set-ups are provided,
   wherein each set-up family is assigned at least one printed circuit board type, and each set-up is assigned at least one component type,
   such that a printed circuit board of a printed circuit board type of a set-up family can be populated by means of components of which include the at least one component type of the set-up assigned to the printed circuit board type on the pick-and-place line;
   wherein the set-up can be implemented in a form of supplies of components and wherein the components include the st least one component type, in order to be fitted on the pick-and-place line,
   wherein the control device is designed:
   to acquire jobs, in each case relating to a population of the printed circuit boards of the printed circuit board type on the pick-and-place line, and associated probabilities with which a job is to be executed in each case;
   to assign the printed circuit boards of which include the at least one circuit board type of the jobs to the set-up families;
   to determine, for each set-up family, a characteristic number which comprises a sum of probabilities of those jobs, the printed circuit board types of which are comprised by the set-up family,
   to optimize assignment in such a way that characteristic numbers of different set-up families are different; and to control the population of the printed circuit boards on the pick-and-place line, where the set-up from one of determined set-up families is fitted on the pick-and-place line.

\* \* \* \* \*